(12) United States Patent
Oba

(10) Patent No.: US 7,595,969 B2
(45) Date of Patent: Sep. 29, 2009

(54) UNDERVOLTAGE WARNING METHOD, UNDERVOLTAGE WARNING CIRCUIT AND SWITCHING POWER SUPPLY

(75) Inventor: Tsunetoshi Oba, Okayama (JP)

(73) Assignee: Omron Corporation, Kyoto-Shi (JP)

( * ) Notice: Subject to any disclaimer, the term of this patent is extended or adjusted under 35 U.S.C. 154(b) by 432 days.

(21) Appl. No.: 11/354,250

(22) Filed: Feb. 15, 2006

(65) Prior Publication Data

US 2006/0203406 A1 Sep. 14, 2006

(30) Foreign Application Priority Data

Mar. 9, 2005 (JP) ............................ P2005-065578

(51) Int. Cl.
*H02H 3/24* (2006.01)
*H02H 3/08* (2006.01)
*H02H 9/02* (2006.01)
*H02H 3/00* (2006.01)

(52) U.S. Cl. ............................ 361/92; 361/93.1; 361/94
(58) Field of Classification Search ........................ None
See application file for complete search history.

(56) References Cited

U.S. PATENT DOCUMENTS

| | | | |
|---|---|---|---|
| 3,670,246 A | | 6/1972 | Gately |
| 4,238,811 A | | 12/1980 | Fry |
| 4,331,996 A | * | 5/1982 | Matsko et al. .................. 361/92 |
| 5,034,728 A | * | 7/1991 | Taylor .......................... 340/663 |
| 5,978,195 A | * | 11/1999 | Goder et al. ................... 361/94 |
| 6,185,082 B1 | * | 2/2001 | Yang ............................ 361/90 |

\* cited by examiner

*Primary Examiner*—Albert W Paladini
*Assistant Examiner*—Dharti Patel
(74) *Attorney, Agent, or Firm*—Foley & Lardner LLP

(57) ABSTRACT

A method for identifying a cause for insufficiency of an output voltage reduced to or below an undervoltage set value comprises a first comparison step for comparing the output voltage to a fixed first undervoltage set value and a second comparison step for comparing the output voltage to a second undervoltage set value that follows up the output voltage with a time lag, wherein the cause for the output voltage insufficiency is identified based on the steps and notified as a warning. As a preferable mode, the first undervoltage set value is set by means of a reverse conducting voltage of a voltage regulating diode D1 and the second undervoltage set value is set by means of a charging voltage of a capacitor C1 for directly or indirectly charging the output voltage.

2 Claims, 4 Drawing Sheets

Fig. 4

| State | Normal | Alternate current input off | Overcurrent | Overvoltage | Overheating | Life | Return |
|---|---|---|---|---|---|---|---|
| Led element 12c | Light off | Light off | Light on | Light off | Light off | Light on | Light off |
| Transistor 12d | Conducted | Non-conducted | Non-conducted | Non-conducted | Non-conducted | Non-conducted | Conducted |
| Led element 13c | Light off | Light off | Light on | Light off | Light off | Light off | Light on |
| Transistor 13d | Conducted | Non-conducted | Non-conducted | Non-conducted | Non-conducted | Conducted | Non-conducted |

Fig. 5

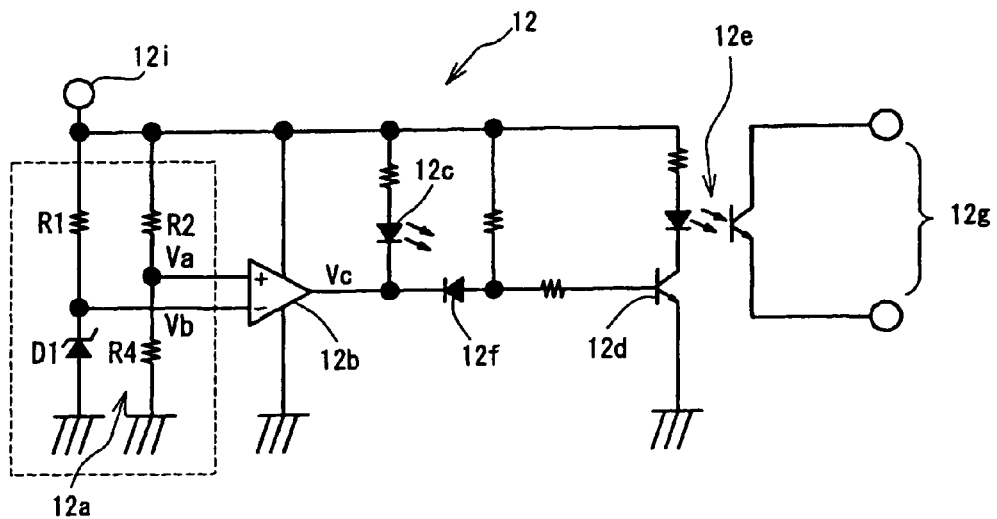

Prior Art

UNDERVOLTAGE WARNING METHOD, UNDERVOLTAGE WARNING CIRCUIT AND SWITCHING POWER SUPPLY

BACKGROUND OF THE INVENTION

1. Field of the Invention

The present invention relates to an output undervoltage warning method for identifying a cause for insufficiency of an output voltage reduced to or below an undervoltage set value, an output undervoltage warning circuit used for executing the method, and a switching power supply.

2. Description of the Related Art

The Patent Literature 1 proposed a power supply capable of displaying an operation state thereof on display devices and thereby monitoring it. The power supply displays whether or not output terminals are in a short-circuit state on two display devices. As a proposal for dealing with the problem that the insufficiency of an output voltage of the power supply may result in the malfunctioning of an electronic device and the like, an undervoltage warning circuit for a warning of the insufficiency of the output voltage of the power supply is additionally provided. FIG. 5 shows a conventional undervoltage warning circuit 12. An output voltage of a switching power supply is applied to a terminal 12$i$ of the output undervoltage warning circuit 12. An input circuit 12$a$ divides the output voltage by resistances R2 and R4, and supplies a divided voltage Va to a plus input unit (+) of a comparing circuit 12$b$ and supplies a constant reverse conducting voltage Vb generated by a resistance R1 and a voltage regulating diode ZD to a minus input unit (−) of the comparing circuit 12$b$. A variation of the voltage with respect to the plus input unit (+) of the comparing circuit 12$b$ is in proportion to a variation of the output voltage. The voltage with respect to the minus input unit (−) of the comparing circuit 12$b$ corresponds to an undervoltage set value.

When the output voltage is normal, Va>Vb is obtained Therefore, an output voltage Vc of the comparing circuit 12$b$ is at a high level, and a LED element 12$c$ is turned off and a transistor 12$d$ is conducted. When the transistor 12$d$ is conducted, a warning signal that indicates that the output voltage is normal is outputted to output terminals 12$g$ via a photocoupler 12$e$. The normal output voltage results in the combination of the LED element 12$c$ being turned off and the transistor 12$d$ being conducted. When the normal state shifts to an overcurrent state, thereby reducing the output voltage applied to the terminal 12$i$ to result in V<Vb, the output voltage Vc of the comparing circuit 12$b$ is at a low level, and the LED element 12$c$ is turned on and the output transistor 12$d$ is non-conducted. The combination of the LED element 12$c$ being turned on and the transistor 12$d$ being non-conducted represents a load abnormality. When a life of a switching power supply 10 has run out, which leads the output voltage to reduce as Va<Vb, the output voltage Vc of the comparing circuit 12$c$ is at the low level. As a result, the LED element 2$c$ is turned on, and the output transistor 12$d$ is non-conducted. The combination of the LED element 12$c$ being turned on and the transistor 12$d$ being non-conducted represents a power supply abnormality. The output voltage of the power supply is reduced to zero when overvoltage, overheating, halt of an alternate current input with respect to the power supply or the like occurs, the LED element 12$c$ is turned off, and the transistor 12$d$ is non-conducted. Any combination of the turned-off LED and the non-conducted transistor represents the power supply abnormality. Among the foregoing combinations, the combinations of the state of the LED element 12$c$ and the state of the output transistor 12$d$ are identical in the case of the output undervoltage insufficiency due to the overcurrent and the exhausted life of the power supply. Therefore, it is not possible to discriminate if the output undervoltage is caused by the load abnormality or the power supply abnormality.

[Patent Document 1] No. 2004-320825 of the Publication of the Unexamined Japanese Patent Applications

SUMMARY OF THE INVENTION

Therefore, a main object of the present invention is to identify a cause for insufficiency of an output voltage when the insufficiency occurs and give a warning of the cause.

An undervoltage warning method according to the present invention is a method of identifying a cause for insufficiency of an output voltage reduced to an undervoltage set value or below and giving a warning of the cause, and comprises a first comparison step for comparing the output voltage to a fixed first undervoltage set value and a second comparison step for comparing the output voltage to a second undervoltage set value that follows up the output voltage with a time lag, wherein the cause for the output voltage insufficiency is identified based on the steps and notified as a warning.

According to the method of the present invention, the output voltage is compared to the first undervoltage set value and the second undervoltage set value in the respective first and second comparison steps so as to identify the cause for the insufficiency. Therefore, two causes for the insufficiency in which a variable speed of the output voltage alone is different can be separately identified and notified. Accordingly, the different causes for the insufficiency due to, for example, an overcurrent state and an expired life of a power supply, which could not be conventionally identified, can be separately identified and notified.

The method of the present invention is preferable in that the first undervoltage set value is set by means of a reverse conducting voltage of a voltage regulating diode and the second undervoltage set value is set by means of a charging voltage of a capacitor for directly or indirectly charging the output voltage so that the insufficiency cause can be identified and notified without fail in a simplified and inexpensive constitution.

According to the method of the present invention, provided that the output voltage is an output voltage of the power supply, a first LED element is turned off when the output voltage is reduced to zero and turned on when the output voltage is reduced to at most the first undervoltage set value, and a first transistor is conducted when the output voltage is at least the first undervoltage set value and non-conducted when the output voltage is at most the first undervoltage set value in the first comparison step, and a second LED element is turned off when the output voltage is reduced to zero and turned on when the output voltage is reduced to at most the second undervoltage set value, and a second transistor is conducted when the output voltage is at least the second undervoltage set value and non-conducted when the output voltage is at most the second undervoltage set value in the second comparison step; and the cause for the output voltage insufficiency is identified and notified as a warning based on the both steps as follows: a power supply abnormality due to at least one of turning off of an alternate current power supply, protection from overvoltage and protection from over heating when the first and second LED elements are turned off and the first and second transistors are non-conducted; the power supply abnormality due to the end of the life the power supply when the first LED element is turned on, the second LED element is turned off, the first transistor is non-conducted, and the second transistor is conducted; and a load abnormality due to overcurrent when the first and second LED elements are turned on and the first and second transistors are non-conducted. In the foregoing manner, the abnormality on the power-supply side such as the turning off of the alternate current power supply, protection from the overvoltage and protection from the overheating, the power supply abnormality due to the ended life thereof, and the load abnormality of the overcurrent can be discriminated from one another and notified.

According to the present invention, if the cause for the undervoltage is the load abnormality or the ended life of the power supply can be determined and the warning of the cause can be issued.

BRIEF DESCRIPTION OF THE DRAWINGS

FIG. 4 shows a table in which the warnings are displayed according to the embodiment.

FIG. 5 shows a circuit diagram of a conventional undervoltage warning circuit.

PREFERRED EMBODIMENT OF THE INVENTION

Figure 1:
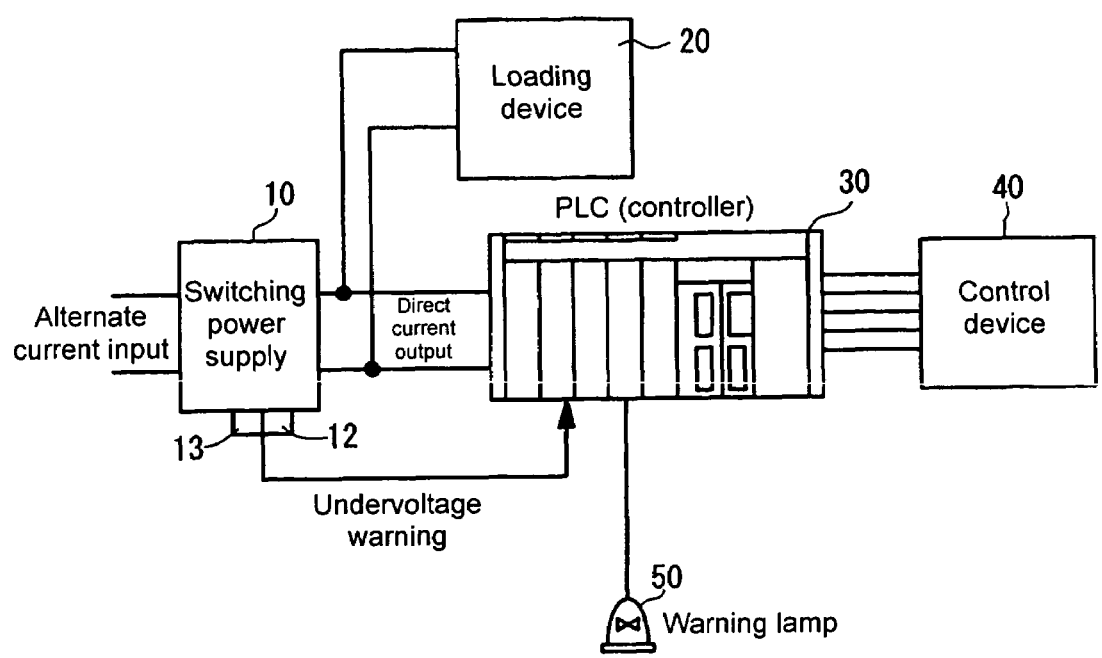
FIG. 1 shows a system diagram including a switching power supply and a PLC controller according to an embodiment of the present invention.
Figure 2:
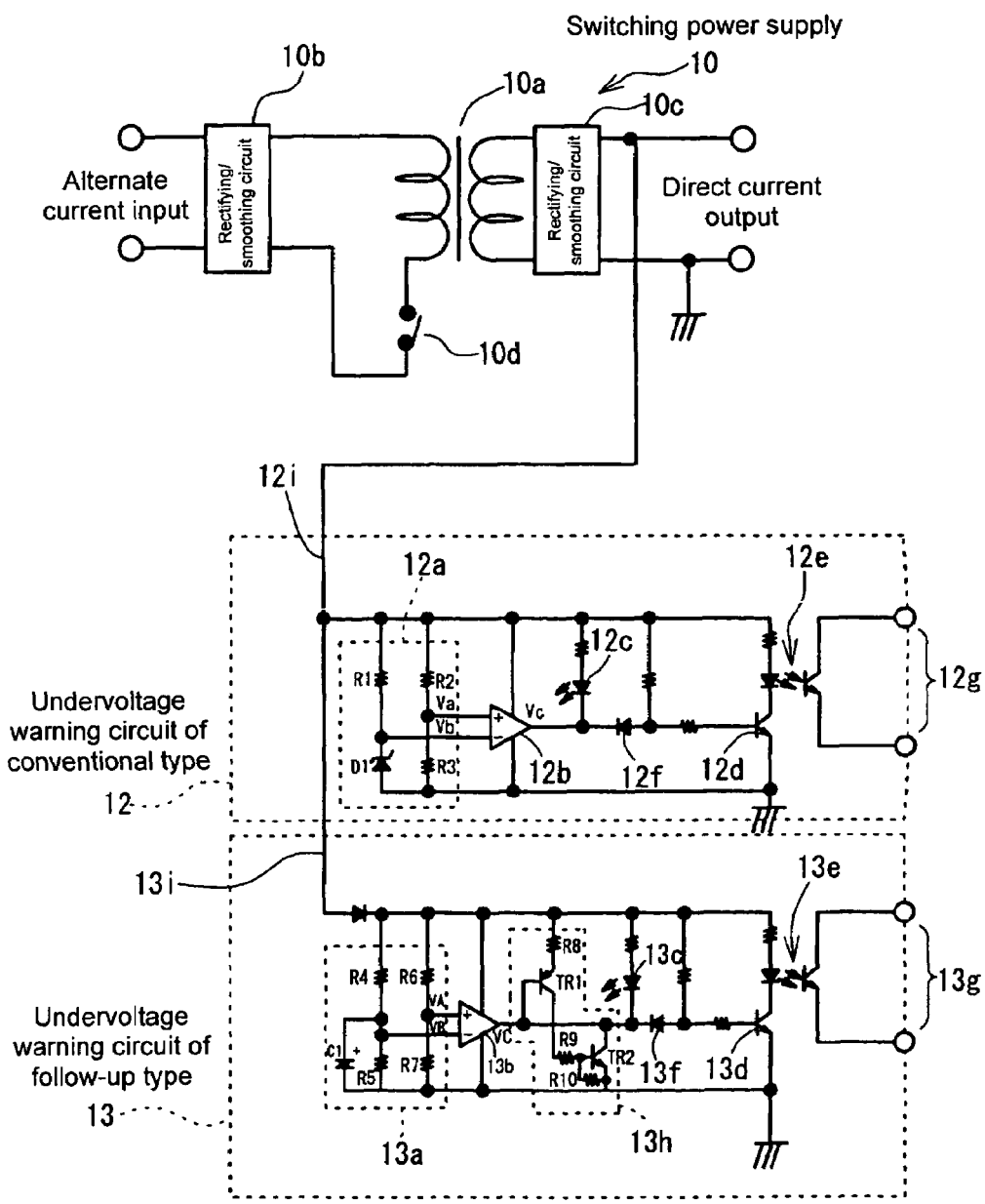
FIG. 2 shows a circuit diagram of the switching power supply.
Figure 3:
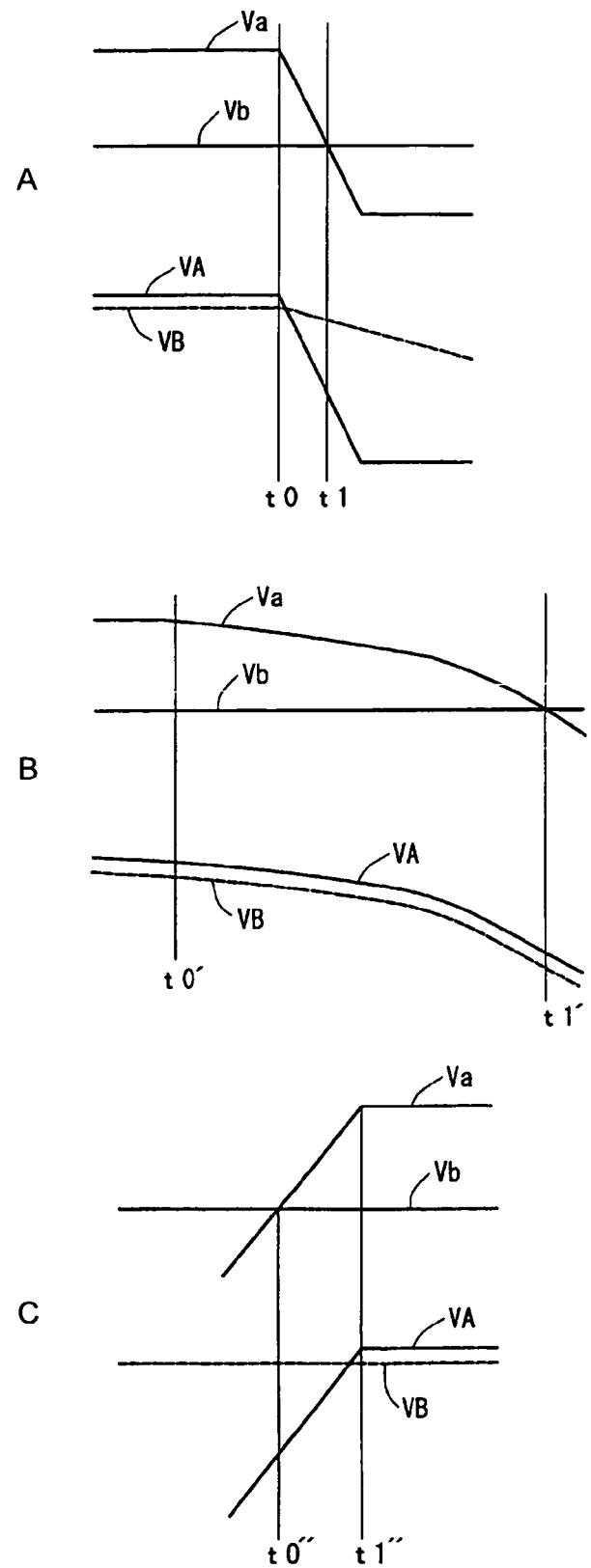
FIG. 3 show timing charts provided for the description of a warning operation of an undervoltage warning circuit.

Hereinafter, a preferred embodiment of an undervoltage warning method according to the present invention is described referring to the drawings. FIG. 1 shows a block diagram illustrating an entire constitution of a PLC controller system. FIG. 2 shows a switching power supply and an undervoltage warning circuit of FIG. 1. FIG. 3 show timing charts of an operation of the switching power supply. FIG. 4 shows a table of undervoltage warning states.

Referring to reference numerals shown in FIG. 1, 10 denotes a switching power supply, 20 denotes a load device, 30 denotes a PLC controller (industrial sequencer), 40 denotes a control device, 50 denotes a warning lamp, and 12 and 13 respectively denote an undervoltage warning circuit. The switching power supply 10 converts an alternate current input into a direct current and supplies the direct-current output to the load device 20 and the PLC controller 30. The PLC controller 30 controls the control device 40. The switching power supply 10 activates a protective function in response to overvoltage, overcurrent, overheating and the like, and thereby reduces an output voltage thereof. When the output voltage of the switching power supply 10 is reduced to be insufficient, the PLC controller 30 may malfunction. The undervoltage warning circuits 12 and 13 supply an undervoltage warning signal to the PLC controller 30 in accordance with the reduction of the output voltage. The PLC controller 30 responds to the input of the undervoltage warning signal to thereby prevent the occurrence of the malfunctioning due to the undervoltage in the PLC controller 30, gives a warning to a user by switching on the warning lamp 50 in advance, or the like, so that the sequence including the control device 40 can be halted.

Referring to FIG. 2, the switching power supply 10 and the undervoltage warning circuits 12 and 13 are described. The switching power supply 10 is provided with the undervoltage warning circuit (referred to as conventional type) 12 constituted in the same manner as shown in FIG. 5 in addition to the undervoltage warning circuit (referred to as follow-up type) 13. The switching power supply 10 is provided with a transformer 10$a$, rectifying/smoothening circuits 10$b$ and 10$c$ on primary and secondary sides, a switch element 10$d$ for executing a voltage regulating control of the output voltage and responding to the protective operations and the like. The switching power supply 10 converts the alternate current input on the primary side into the direct-current output and outputs it, and is provided with protective circuits not shown in order to deal with the overcurrent, overvoltage, overheating and the like. These protective circuits reduce the output voltage in response to the overcurrent, overvoltage, overheating and the like. For example, the operation of the switching power supply 10 is halted so as to reduce the output voltage to zero in the case of the overvoltage and overheating, while the output voltage is reduce to a predetermined value in the case of the overcurrent.

The output voltage is applied to the undervoltage warning circuit 12 of the conventional type from the switching power supply 10 via a terminal 12$i$. The undervoltage warning circuit 12 executes a first comparison step for comparing the output voltage to a first undervoltage set value described later, and comprises an input circuit 12$e$, a comparing circuit 12$b$, an LED element 12$c$, an output transistor 12$d$, a photocoupler 12$e$, a diode 12$f$, and warning signal output terminals 12$g$. The input circuit 12$a$ comprises resistances R1-R3 and a voltage regulating diode D1. An voltage where the resistance R1 and the voltage regulating diode D1 are connected is inputted to a minus input unit of the comparing circuit 12$b$, and a voltage where the resistances R2 and R3 are connected is inputted to a plus input unit of the comparing circuit 12$b$. A connection voltage Va of the resistances R2 and R3 is a voltage value obtained by dividing the output voltage. A connection voltage Vb of the resistance R1 and the voltage regulating diode D1 is the first undervoltage set value. The first undervoltage set value, which is a reverse conducting voltage of the voltage regulating diode D1, is a fixed and constant value. The voltage Va is supplied to the plus input unit of the comparing circuit 12$b$, while the voltage Vb is supplied to the minus input unit. An output voltage Vc of the comparing circuit 12$b$ is at a high level when Va>Vb, and at a low level when Va<Vb.

The LED element 12$c$ is turned on when the output level of the comparing circuit 12$b$ is low, and turned off when high. The output transistor 12$d$ is non-conducted because the diode 12$f$ is conducted when the output level of the comparing circuit 12$b$ is low, and conducted because the diode 12$f$ is non-conducted when the output level of the comparing circuit 12$b$ is high. The photocoupler 12$e$ makes the warning signal output terminals 12$g$ generate the undervoltage warning signal in accordance with the conduction/non-conduction of the output transistor 12$d$.

To the undervoltage warning circuit 13 of the follow-up type is applied the output voltage from the switching power supply 10 via a terminal 13$i$. The undervoltage warning circuit 13 executes a second comparison step for comparing the output voltage to a second undervoltage set value described later, and comprises an input circuit 13$a$, a comparing circuit 13$b$, an LED element 13$c$, an output transistor 13$d$, a photocoupler 13$e$, a diode 13$f$, warning signal output terminals 13$g$, and a latch circuit 13$h$. The input circuit 13$a$ comprises resistances R4-R7 and a capacitor C1. The capacitor C1 and the resistance R5 are connected in parallel. A voltage where the resistance R4 and the capacitor C1 are connected is supplied to a minus input unit of the comparing circuit 13$b$, and a voltage where the resistances R6 and R7 are connected is supplied to a plus input unit of the comparing circuit 13b. A connection voltage Va of the resistances R6 and R7 is a voltage value obtained by dividing the output voltage. A charging voltage VB of the capacitor C1 is the second undervoltage set value. The second undervoltage set value shows a voltage value that follows up the variation of the output voltage, however, gradually reduces though the output voltage rapidly drops. The voltage VA is supplied to the plus input unit of the comparing circuit 13b, while the voltage VB is supplied to the minus input unit. An output voltage VC of the comparing circuit 13b is at a high level when VA>VB, and at a low level when VA<VB.

The LED element 13c is turned on when the output level of the comparing circuit 13b is low and turned off when high. The output transistor 13d is non-conducted when the diode 13f is conducted because the output level of the comparing circuit 13b is low, while being conducted when the diode 13f is non-conducted because the output level of the comparing circuit 13b is high. The photocoupler 13e generates the undervoltage warning signal in the warning signal output terminals 13g in accordance with the conduction/non-conduction of the output transistor 13d. The latch circuit 13h comprises resistances R8-R10 and transistors TR1 and TR2. When the output level of the comparing circuit 13b becomes low, the latch circuit 13h maintains the state of the low level. Thereby, for example, when the output voltage is instantaneously reduced and returned to an original level due to some kind of factor, the state of the reduction and the return to the original level is maintained. As a result, the history of the reduction of the output voltage can be effectively tracked back afterwards.

Referring to FIG. 3, the warning using the undervoltage warning circuit 12 of the conventional type and the warning using the undervoltage warning circuit 13 of the follow-up type are described. Though not necessarily shown in the drawing, when the output voltage is reduced to zero due to the overvoltage, halt of the alternate current input and overheating, the undervoltage warning circuit 12 of the conventional type and the undervoltage warning circuit 13 of the follow-up type are no longer power-supplied. Then, the LED elements 12c and 13c are turned off, and the transistors 12d and 13d are non-conducted.

As shown in FIG. 3A, when the output voltage rapidly reduces at and after time t0 due to the overcurrent, the voltage Va at the plus input unit of the comparing circuit 12b in the undervoltage warning circuit 12 of the conventional type also rapidly reduces at and after the time t0. As a result, Va<Vb is obtained at time t1 because the voltage Vb at the minus input unit (first undervoltage set value) has the fixed value. Then, the output level of the comparing circuit 12b shifts from the high level to the low level, and the LED element 12c is turned on, while the transistor 12d is non-conducted. In that case, the voltage Va is at least a voltage at which the LED element 12c is turned on.

When the voltage VA at the plus input unit of the comparing circuit 13b in the undervoltage warning circuit 13 of the follow-up type rapidly reduces at and after the time t0, the voltage VB at the minus input unit of the comparing circuit 13b gradually reduces. As a result, VA<VB is already obtained immediately after the time t0. Then, the output level of the comparing circuit 13b shifts to the low level, and the LED element 13c is turned on. The voltage VA is at least a voltage at which the LED element 13c is turned on. In that case, the transistor 13d is non-conducted because the output voltage is reduced.

Therefore, as shown in FIG. 3A, the load abnormality can be identified because the LED elements 12c and 13c are turned on and the transistors 12d and 13d are non-conducted due to the overcurrent.

As shown in FIG. 3B, when the output voltage gradually reduces at and after time t0' due to the expired life of the power supply, the voltage Va at the plus input unit of the comparing circuit 12b in the undervoltage warning circuit 12 of the conventional type gradually reduces at and after the time 0'. As a result, Va<Vb is obtained at time t1' because the voltage Vb at the minus input unit has the fixed value. Then, the output level of the comparing circuit 12b shifts from the high level to the low level, and the LED element 12c is turned on, while the transistor 12d is non-conducted. The voltage Va is at least the voltage at which the LED element 12c is turned on. The voltage VA at the plus input unit of the comparing circuit 13b in the undervoltage warning circuit 13 of the follow-up type also gradually reduces at and after the time t0', and the voltage VB at the minus input unit of the comparing circuit 13b gradually reduces. Therefore, VA<VB is not obtained at the time 1' with no change in the output level of the comparing circuit 13b, and the LED element 13c is thereby turned off. In that case, the transistor 13d is conducted.

As a result, as shown in FIG. 3B, the LED element 12c is turned on, the LED element 13c is turned off, the transistor 12d is non-conducted, and the transistor 13d is conducted in the case of the consumed life of the power supply, which identify that the abnormality is generated in the power supply.

As shown in FIG. 3C, in the case of returning to the original state from the instantaneous halt, overcurrent, short circuit or the like, Va>Vb is obtained at and after time t0" in the relationship between the voltage Va at the plus input unit and the voltage Vb at the minus input unit of the comparing circuit 12b in the undervoltage warning circuit 12 of the conventional type. As a result, the output level of the comparing circuit 12b shifts from the low level to the high level, and the LED element 12c is turned off, while the transistor 12d is conducted in response to the increase of the output voltage. In contrast, VA>VB is not obtained at and after the time t0" and until time 1" in the relationship between the voltage VA at the plus input unit and the voltage VB at the minus input unit of the comparing circuit 13b in the undervoltage warning circuit 13 of the follow-up type. Further, the output level of the comparing circuit 13b stays low because of the function of the latch circuit 13h. Then, the LED element 13c is turned on, while the transistor 13d remains non-conducted.

The foregoing description can be summarized into a relationship table shown in FIG. 4. When the output voltage is normal, the LED elements 12c and 13c are turned off, and the transistors 12d and 13d are conducted. When the alternate current input is turned off, the LED elements 12c and 13c are turned off, and the transistors 12d and 13d are non-conducted. Due to the overcurrent, the LED elements 12c and 13c are turned on, and the transistors 12d and 13d are non-conducted. Due to the overvoltage and overheating, the LED elements 12c and 13c are turned off, and the transistors 12d and 13d are non-conducted. Due to the consumed life of the power supply, the LED element 12c is turned on, the LED element 13c is turned off, the transistor 12d is non-conducted, and the transistor 13d is conducted. After returning to the original state from the instantaneous halt, overcurrent state and short circuit, the LED element 12c is turned off, the LED element 13c is turned on, the transistor 12d is conducted, and the transistor 13d is non-conducted.

The present invention is not limited to the embodiment described so far, and includes various modifications within the scope recited in the Scope of Claims.

What is claimed is:

1. An undervoltage warning circuit comprising:

a first comparing circuit having two input units in order to execute a first comparison step;

a first input circuit for inputting a voltage corresponding to a variation of an output voltage to one of the input units of the first comparing circuit and inputting the first undervoltage set value to the other input unit, wherein the first input circuit is a circuit for inputting the output voltage or a divided voltage of the output voltage to one of the input units of the first comparing circuit and inputting a constant voltage to the other input unit;

a second comparing circuit having two input units in order to execute the second comparison step;

a second input circuit for inputting a voltage corresponding to a variation of the output voltage to one of the input units of the second comparing circuit and inputting the second undervoltage set value that follows up the output voltage with a time lag to the other input unit wherein the second input circuit is a circuit for inputting the output voltage or a divided voltage of the output voltage to one of the input units of the second comparing circuit and inputting a charging voltage of a capacitor for charging the output voltage via a resistance to the other input unit; and wherein the first comparing circuit compares the output voltage to the first undervoltage set value to thereby output a result of the comparison so that the first LED element is turned on when the output voltage is at most the first undervoltage set value, the first transistor is conducted when the output voltage is at least the first undervoltage set value, and the first transistor is non-conducted when the output voltage is at most the first undervoltage set value, and the second comparing circuit compares the output voltage to the second undervoltage set value to thereby output a result of the comparison so that the second LED element is turned on when the output voltage is at most the second undervoltage set value, the second transistor is conducted when the output voltage is at least the second undervoltage set value, and the second transistor is non-conducted when the output voltage is at most the second undervoltage set value.

2. A switching power supply comprising the warning circuit claimed in claim 1.

* * * * *